(12) United States Patent
Kanbe

(10) Patent No.: US 8,319,877 B2
(45) Date of Patent: Nov. 27, 2012

(54) SOLID-STATE IMAGING DEVICE, METHOD OF MANUFACTURING SOLID-STATE IMAGING DEVICE, AND ELECTRONIC APPARATUS

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 405 days.

(21) Appl. No.: 12/556,315

(22) Filed: Sep. 9, 2009

(65) Prior Publication Data
US 2010/0066886 A1 Mar. 18, 2010

(30) Foreign Application Priority Data
Sep. 18, 2008 (JP) ................................. 2008-239902

(51) Int. Cl.
*H04N 5/335* (2006.01)
*H04N 3/14* (2006.01)
(52) U.S. Cl. ........................ 348/311; 348/294
(58) Field of Classification Search .................... 438/73, 438/142, 144–148, 48; 257/213, 215–251, 257/291–292; 348/294–324; 250/208.1
See application file for complete search history.

(56) References Cited

U.S. PATENT DOCUMENTS
2005/0062868 A1* 3/2005 Shiiba et al. .................. 348/316
2007/0003261 A1* 1/2007 Yamasaki ........................ 396/55
2007/0164334 A1* 7/2007 Kanbe ............................ 257/294

FOREIGN PATENT DOCUMENTS
JP 2006-319184 11/2006
* cited by examiner

*Primary Examiner* — Nhan T Tran
*Assistant Examiner* — Yih-Sien Kao
(74) *Attorney, Agent, or Firm* — SNR Denton US LLP

(57) ABSTRACT

A solid-state imaging device includes a pixel section including light receiving sensors, horizontally spaced vertical transfer registers including vertical transfer channel regions and vertical transfer electrodes formed above the vertical transfer channel regions, vertically spaced horizontal transfer registers each including a horizontal transfer channel region and horizontal transfer electrodes formed side by side in a horizontal direction above the horizontal transfer channel region and formed in the same layer as the vertical transfer electrodes, and a horizontal-to-horizontal transfer portion formed between adjacent two of the horizontal transfer registers and including a horizontal-to-horizontal transfer channel region interconnecting respective parts of the horizontal transfer channel regions positioned under the horizontal transfer electrodes to which the transfer drive pulses having different phases are applied, and a horizontal-to-horizontal transfer electrode formed above the horizontal-to-horizontal transfer channel region in the same layer as both the vertical transfer electrodes and the horizontal transfer electrodes.

14 Claims, 9 Drawing Sheets

SOLID-STATE IMAGING DEVICE, METHOD OF MANUFACTURING SOLID-STATE IMAGING DEVICE, AND ELECTRONIC APPARATUS

BACKGROUND OF THE INVENTION

1. Field of the Invention

The present invention relates to a solid-state imaging device of, e.g., CCD (Charge Coupled Device) type, a method of manufacturing the solid-state imaging device, and an electronic apparatus including the solid-state imaging device.

2. Description of the Related Art

As one example of solid-state imaging devices, there is a device employing a charge coupled device (CCD). In the CCD solid-state imaging device, a plurality of light receiving sensors are arrayed in a two-dimensional matrix pattern and are each made of a photodiode (PD), i.e., a photoelectric transducer for generating and accumulating signal charges that correspond to the amount of light received by the photoelectric transducer. The signal charges are generated and accumulated based on light signals received from a subject (i.e., an object of shooting), which enters the photodiodes of the plural light receiving sensors. The signal charges are transferred in the vertical direction by vertical transfer registers which are arranged in a one-to-one relation to columns of the light receiving sensors, and are also transferred in the horizontal direction by a horizontal transfer register having the CCD structure. The signal charges transferred in the horizontal direction are output as image information of the subject from an output section including a charge-voltage converter.

As an improvement in the solid-state imaging device of the above-described type, a solid-state imaging device having a plurality of horizontal transfer registers has been recently developed to be adapted for an electronic apparatus having higher resolution, such as a digital high-vision TV (High Resolution Digital Television).

FIG. 8 is a schematic view of principal part of a solid-state imaging device having two horizontal transfer registers, which is disclosed in Japanese Unexamined Patent Application Publication No. 2006-319184. More specifically, FIG. 8 illustrates part of a pixel section 101 of the solid-state imaging device, which includes vertical transfer registers in respective final stages, a first horizontal transfer register 102, and a second horizontal transfer register 104.

The vertical transfer registers include vertical transfer channel regions 105A and 105B which are formed in a substrate 100 and are separated per column by channel stop regions 106, and a vertical transfer electrode 112 formed above the vertical transfer channel regions 105A and 105B to extend in the horizontal direction. As illustrated in FIG. 8, the vertical transfer channel regions 105A and 105B are alternately formed in the horizontal direction.

The first horizontal transfer register 102 is formed at transfer end positions of the vertical transfer registers in respective final stages. The second horizontal transfer register 104 is disposed to extend parallel to the first horizontal transfer register 102. Further, a horizontal-to-horizontal transfer portion 103 is formed between the first horizontal transfer register 102 and the second horizontal transfer register 104.

The first horizontal transfer register 102 and the respectively horizontal transfer channel regions 114 and 115, respectively, which are formed in the substrate 100 to extend in the horizontal direction, and transfer electrodes 107A and 107B and storage electrodes 108A and 108B which are alternately formed above the horizontal transfer channel regions 114 and 115 to extend in the vertical direction as viewed in FIG. 8. Storage regions are formed in parts of the horizontal transfer channel regions 114 and 115 under the storage electrodes 108A and 108B. Also, transfer regions are formed in parts of the horizontal transfer channel regions 114 and 115 under the transfer electrodes 107A and 107B. The transfer electrode 107A is connected to the vertical transfer channel region 105A, and the transfer electrode 107B is connected to the vertical transfer channel region 105B. Further, the storage electrodes 108A and 108B are each formed between the transfer electrodes 107A and 107B in an alternate sequence. A clock signal $\phi 1$ is applied to the transfer electrode 107A and the storage electrode 108B, and a clock signal $\phi 2$ is applied to the transfer electrode 107B and the storage electrode 108B.

The transfer electrodes 107A and 107B and the storage electrodes 108A and 108B are formed in common to the first horizontal transfer register 102 and the second horizontal transfer register 104, while those electrodes extend obliquely in parts positioned above the horizontal-to-horizontal transfer portion 103.

The horizontal-to-horizontal transfer portion 103 includes a horizontal-to-horizontal channel region 110, a channel stop region 109, and a horizontal-to-horizontal transfer electrode 111 formed above those regions 110 and 109. The horizontal-to-horizontal channel region 110 is formed to extend between the transfer region in part of the first horizontal transfer register 102 positioned under the transfer electrode 107A and the transfer region in part of the second horizontal transfer register 104 positioned under the transfer electrode 107B. The other part of the horizontal-to-horizontal channel region 110 than those transfer regions is formed as the channel stop region 109. A clock signal $\phi HHG$ is applied to the horizontal-to-horizontal transfer electrode 111.

In the solid-state imaging device having the above-described construction, signal charges held in the vertical transfer channel region 105A of the vertical transfer register in the final stage are first transferred to the transfer region 107A of the first horizontal transfer register 102 upon application of the transfer drive pulse (clock signal) $\phi 1$.

The signal charges having been transferred from the vertical transfer channel region 105A are then transferred to the horizontal-to-horizontal channel region 110 of the horizontal-to-horizontal transfer portion 103 upon application of the transfer drive pulse (clock signal) $\phi HGG$.

The signal charges held in the horizontal-to-horizontal channel region 110 are then transferred to the transfer region of the second horizontal transfer register 104 under the transfer electrode 107B upon application of the transfer drive pulse (clock signal) $\phi 2$. Simultaneously, signal charges held in the vertical transfer channel region 105B are transferred to the transfer region of the first horizontal transfer register 102 under the transfer electrode 107B.

In other words, only the signal charges having been transferred through the vertical transfer channel region 105A are transferred to the second horizontal transfer register 104, while the signal charges having been transferred through the vertical transfer channel region 105B remain within the first horizontal transfer register 102.

As a result, the signal charges in the vertical transfer registers in successive columns are alternately allocated to the first horizontal transfer register 102 and the second horizontal transfer register 104. The signal charges having been transferred to the first horizontal transfer register 102 and the second horizontal transfer register 104 are further transferred as video signals in the horizontal direction.

SUMMARY OF THE INVENTION

In the solid-state imaging device having two horizontal transfer registers, the transfer portion between the two horizontal transfer registers is employed, as described above, because of the necessity of transferring the signal charges between the plural horizontal transfer registers. This increases the number of layers of the transfer electrodes to be formed in the solid-state imaging device.

FIG. 9 illustrates a sectional structure, taken along a line X-X, of the horizontal-to-horizontal transfer electrode 111 in the solid-state imaging device of the related art, illustrated in FIG. 8. A structure in which the transfer electrode 107A, the storage electrode 108B, and the horizontal-to-horizontal transfer electrode 111 are overlapped with one another has at least three layers, as seen from FIG. 9. Thus, forming three layers of electrodes has a demerit that three steps for forming those electrodes are necessitated and a manufacturing process is prolonged.

Further, those electrodes are each formed of polysilicon, and adjacent polysilicon electrodes are insulated from each other by an interlayer insulating film that is formed of an oxide film 113. In a step of forming the oxide film 113, however, silicon forming the polysilicon electrode itself is consumed and hence the line width of the polysilicon electrode is narrowed. Stated another way, because an oxidation process is executed three times to form three layers of the oxide films 113 in the steps of forming the three layers of the polysilicon electrodes, a narrowing phenomenon of the polysilicon electrodes occurs more significantly. In general, further miniaturization of a device element is realized by reducing the size of each polysilicon electrode. However, when the width of the polysilicon electrode having the reduced size is further narrowed during the manufacturing process, problems may arise in points of, for example, increasing wiring resistance and causing a line break. Accordingly, reliability of the solid-state imaging device is not ensured. For that reason, the solid-state imaging device including the three layers of the polysilicon electrodes has a demerit of a difficulty in realizing further miniaturization of the device element.

Moreover, when the polysilicon electrodes are formed in three layers, the oxide film 113 between the polysilicon electrodes of the first and third layers is necessarily formed for a longer oxidation time than that taken to form the oxide film 113 between the polysilicon electrodes of the first and second layers or the oxide film 113 between the polysilicon electrodes of the second and third layers. Thus, the oxide film 113 between the polysilicon electrodes of the first and third layers has a larger thickness. From the viewpoint of realizing lower-voltage driving in the CCD solid-state imaging device, it is effective to reduce the thickness of the interlayer insulating film that is made of the oxide film 113. The interlayer insulating film having a larger thickness may impair transfer of the signal charges.

In the state of the art described above, there is a need for a solid-state imaging device which can reduce the number of manufacturing steps, which is adaptable for further miniaturization of a device element, and which can ensure lower-voltage driving. There is also a need for a method of manufacturing the solid-state imaging device and an electronic apparatus including the solid-state imaging device.

According to an embodiment of the present invention, there is provided a solid-state imaging device including a pixel section, a vertical transfer register, a horizontal transfer register, a horizontal-to-horizontal transfer portion, and a shunt line. These components are constructed as follows.

The pixel section includes a plurality of light receiving sensors.

The vertical transfer register includes a vertical transfer channel region formed between horizontally adjacent two of the light receiving sensors, and a vertical transfer electrode formed above the vertical transfer channel region. The vertical transfer register is formed in plural in a horizontally spaced relation.

The horizontal transfer register includes a horizontal transfer channel region and a plurality of horizontal transfer electrodes which are formed side by side in a horizontal direction above the horizontal transfer channel region and which are arranged such that transfer drive pulses having different phases are applied to adjacent two of the horizontal transfer electrodes. The horizontal transfer electrodes are formed in the same layer as the vertical transfer electrodes. The horizontal transfer register is formed in plural in a vertically spaced relation.

The horizontal-to-horizontal transfer portion is formed between adjacent two of the horizontal transfer registers and includes a horizontal-to-horizontal transfer channel region interconnecting respective parts of the horizontal transfer channel regions positioned under the horizontal transfer electrodes to which the transfer drive pulses having different phases are applied. Further, the horizontal-to-horizontal transfer portion includes a horizontal-to-horizontal transfer electrode formed above the horizontal-to-horizontal transfer channel region in the same layer as both the vertical transfer electrodes and the horizontal transfer electrodes.

The shunt line is formed in plural and interconnects the horizontal transfer electrodes, which are supplied with the transfer drive pulses having the same phase, between adjacent two of the horizontal transfer registers.

Thus, in the solid-state imaging device according to the embodiment of the present invention, the vertical transfer electrodes, the horizontal transfer electrodes, and the horizontal-to-horizontal transfer electrode are formed in the same layer. Accordingly, there is no interlayer insulating film between two among the vertical transfer electrode, the horizontal transfer electrode, and the horizontal-to-horizontal transfer electrode. Further, the horizontal transfer electrodes are separated from each other between vertically adjacent two of the horizontal transfer registers, and those ones of the horizontal transfer electrodes, which are supplied with the transfer drive pulses having the same phase, are connected to each other by the shunt line between the horizontal transfer registers.

A method of manufacturing a solid-state imaging device, according to another embodiment of the present invention, includes the following steps. First, a plurality of vertical transfer channel regions are formed in a substrate such that vertical transfer channel regions are spaced-apart adjacent to each other in a horizontal direction. Next, a plurality of horizontal transfer channel regions are formed in the substrate such that the horizontal transfer channel regions are spaced-apart adjacent to each other in a vertical direction. Next, a horizontal-to-horizontal transfer channel region is formed between adjacent two of the horizontal transfer channel regions. Next, a first electrode material layer is formed on the substrate. Next, the first electrode material layer is patterned to form vertical transfer electrodes above the vertical transfer channel regions, a plurality of horizontal transfer electrodes arranged side by side in the horizontal direction above each of the horizontal transfer channel regions, and a horizontal-to-horizontal transfer electrode above the horizontal-to-horizontal transfer channel region. Next, a second electrode material layer is formed on the vertical transfer channel regions, the plurality of horizontal transfer electrodes, and the horizontal-to-horizontal transfer electrode. Next, the second electrode material layer is patterned to form a plurality of shunt lines each interconnecting those ones of the plurality of horizontal transfer electrodes formed above adjacent two of the horizontal transfer channel regions, which are supplied with transfer drive pulses having the same phase.

Thus, in the method of manufacturing the solid-state imaging device according to the other embodiment of the present invention, the vertical transfer electrodes, the horizontal transfer electrodes, and the horizontal-to-horizontal transfer electrode are formed in the same step and are formed by the first electrode material layer. Further, the plurality of shunt lines are formed by the second electrode material layer.

An electronic apparatus according to still another embodiment of the present invention includes an optical lens, a solid-state imaging device, and a signal processing circuit. The solid-state imaging device includes a pixel section, a vertical transfer register, a horizontal transfer register, a horizontal-to-horizontal transfer portion, and a shunt line.

The pixel section includes a plurality of light receiving sensors.

The vertical transfer register includes a vertical transfer channel region formed between horizontally adjacent two of the light receiving sensors, and a vertical transfer electrode formed above the vertical transfer channel region. The vertical transfer register is formed in plural in a horizontally spaced relation.

The horizontal transfer register includes a horizontal transfer channel region and a plurality of horizontal transfer electrodes which are formed side by side in a horizontal direction above the horizontal transfer channel region and which are arranged such that transfer drive pulses having different phases are applied to adjacent two of the horizontal transfer electrodes. The horizontal transfer electrodes are formed in the same layer as the vertical transfer electrodes. The horizontal transfer register is formed in plural in a vertically spaced relation.

The horizontal-to-horizontal transfer portion is formed between adjacent two of the horizontal transfer registers and includes a horizontal-to-horizontal transfer channel region interconnecting respective parts of the horizontal transfer channel regions positioned under the horizontal transfer electrodes to which the transfer drive pulses having different phases are applied. Further, the horizontal-to-horizontal transfer portion includes a horizontal-to-horizontal transfer electrode formed above the horizontal-to-horizontal transfer channel region in the same layer as both the vertical transfer electrodes and the horizontal transfer electrodes.

The shunt line is formed in plural and interconnects the horizontal transfer electrodes, which are supplied with the transfer drive pulses having the same phase, between adjacent two of the horizontal transfer registers.

Thus, in the electronic apparatus according to the still other embodiment of the present invention, there is no interlayer insulating film between two among the vertical transfer electrode, the horizontal transfer electrode, and the horizontal-to-horizontal transfer electrode.

With the solid-state imaging device according to the embodiment of the present invention, a smaller pixel size can be realized and lower-voltage driving can be ensured. Also, with the method of manufacturing the solid-state imaging device according to the other embodiment of the present invention, the number of manufacturing steps can be reduced. Further, with the electronic apparatus according to the still other embodiment of the present invention, the electronic apparatus can be driven at a lower voltage by using the solid-state imaging device which ensures the lower-voltage driving.

DESCRIPTION OF THE PREFERRED EMBODIMENTS

Embodiments of the present invention will be described below with reference to FIGS. 1 to 7.
<Solid-State Imaging Device According to Embodiment of Present Invention>
[Overall Construction of Solid-State Imaging Device]

Figure 1:
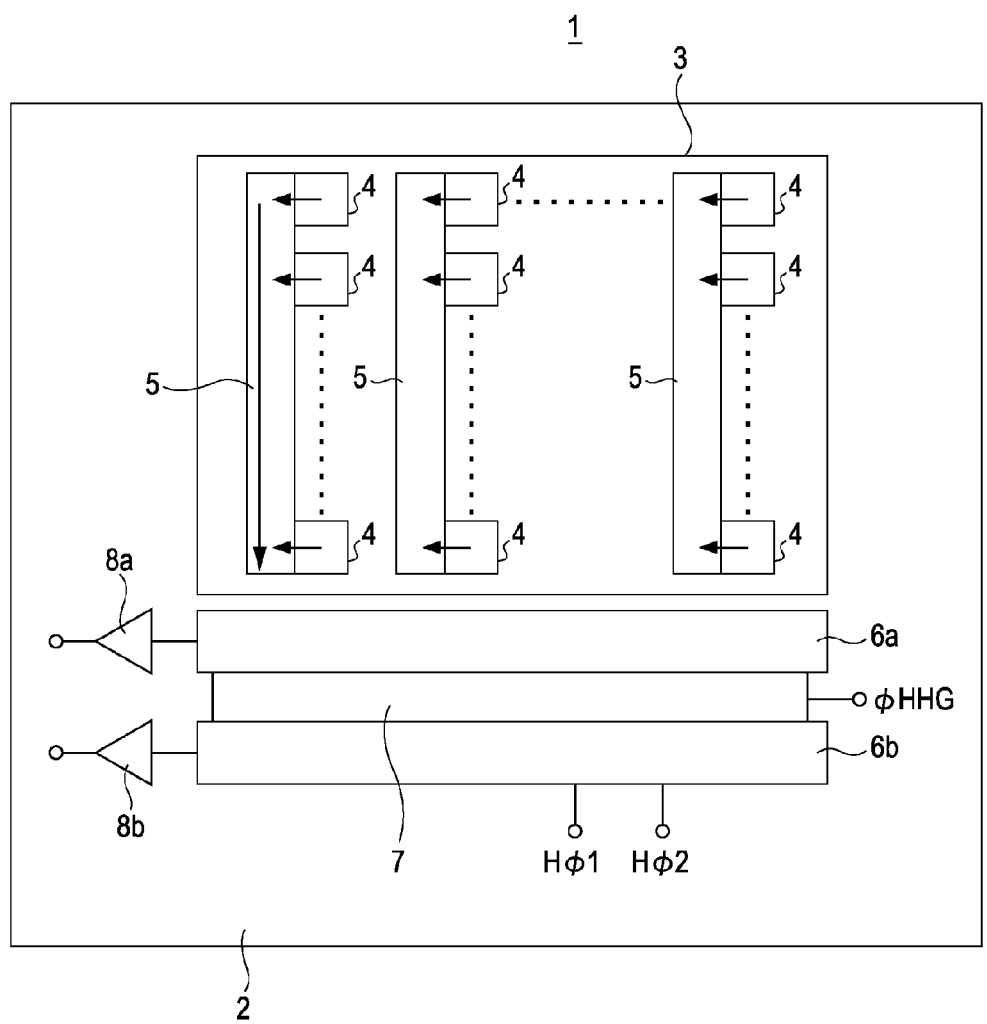
FIG. 1 is a block diagram of a solid-state imaging device according to an embodiment of the present invention.

FIG. 1 is a block diagram illustrating an overall construction of a CCD solid-state imaging device according to the embodiment of the present invention.

As illustrated in FIG. 1, a CCD solid-state imaging device 1 according to the embodiment includes a plurality of light receiving sensors 4, a plurality of vertical transfer registers 5 each having the CCD structure, and first and second horizontal transfer registers 6a and 6b each having the CCD structure, which are formed in and on a substrate 2. A pixel section 3 is formed by the light receiving sensors 4 and the vertical transfer registers 5. The CCD solid-state imaging device 1 further includes a horizontal-to-horizontal transfer portion (hereinafter referred to as an "H-H transfer portion") 7 formed between the first and second horizontal transfer registers 6a and 6b, and output circuits 8a and 8b connected respectively to the first and second horizontal transfer registers 6a and 6b. Thus, the solid-state imaging device 1 according to the embodiment includes two horizontal transfer registers.

Each of the light receiving sensors 4 is formed of a photoelectric transducer, i.e., a photodiode, and serves to generate and accumulate signal charges. In the illustrated embodiment, the plurality of light receiving sensors 4 are arrayed in a two-dimensional matrix pattern in the horizontal direction and the vertical direction of the substrate 2 as viewed in FIG. 1.

Corresponding to columns of the light receiving sensors 4 arrayed in the vertical direction, the plurality of vertical transfer registers 5 are formed to extend in the vertical direction between the columns of the light receiving sensors 4, which are adjacent to each other in the horizontal direction. Each of the vertical transfer registers 5 serves to read the signal charges accumulated in the light receiving sensors 4 and to transfer the signal charges in the vertical direction. In this embodiment, a transfer stage including the vertical transfer register 5 formed therein is 4-phase driven by transfer drive pulses V$\phi$1 to V$\phi$4 which are applied from a transfer drive pulse circuit (not shown). Further, in a final stage of the vertical transfer register 5, signal charges held in the final stage is transferred to the first horizontal transfer register 6a upon application of a transfer drive pulse VOG.

The first horizontal transfer register 6a is formed to extend along respective one ends of the vertical transfer registers 5 in their final stages. A transfer stage including the first horizontal transfer register 6a formed therein serves to transfer part of the signal charges vertically transferred through each of the vertical transfer registers 5 in the horizontal direction per horizontal line.

The second horizontal transfer register 6b is formed to extend parallel to the first horizontal transfer register 6a at a position on the side of the first horizontal transfer register 6a away from the vertical transfer register 5. A transfer stage including the second horizontal transfer register 6b formed therein serves to transfer the remaining part of the signal charges, which has been transferred through the H-H transfer portion 7 without being horizontally transferred by the first horizontal transfer register 6a, in the horizontal direction per horizontal line.

The first horizontal transfer register 6a and the second horizontal transfer register 6b in this embodiment are 2-phase driven by using transfer drive pulses H$\phi$1 and H$\phi$2 which are applied from a transfer drive pulse circuit (not shown).

The H-H transfer portion 7 is formed between the first horizontal transfer register 6a and the second horizontal transfer register 6b. A transfer stage including the H-H transfer register 7 formed therein serves to transfer the part of the signal charges having been transferred to the first horizontal transfer register 6a from each of the vertical transfer registers 5. The H-H transfer portion 7 is driven by a transfer drive pulse HHG.

The output circuit 8a serves to output, as a video signal, the signal charges having been horizontally transferred by the first horizontal transfer register 6a after charge-voltage conversion.

The output circuit 8b serves to output, as a video signal, the signal charges having been horizontally transferred by the second horizontal transfer register 6b after charge-voltage conversion.

In the solid-state imaging device 1 constructed as described above, the signal charges accumulated in each of the light receiving sensors 4 are vertically transferred by the vertical transfer register 5 and are then transferred to the first horizontal transfer register 6a. Part of the signal charges having been transferred to the first horizontal transfer register 6a is further transferred to the second horizontal transfer register 6b through the H-H transfer portion 7. The signal charges in the first horizontal transfer register 6a and the second horizontal transfer register 6b are transferred in the horizontal direction and are output as the video signals through the output circuits 8a and 8b.

[Construction of Principal Part of Solid-State Imaging Device]

Figure 2:
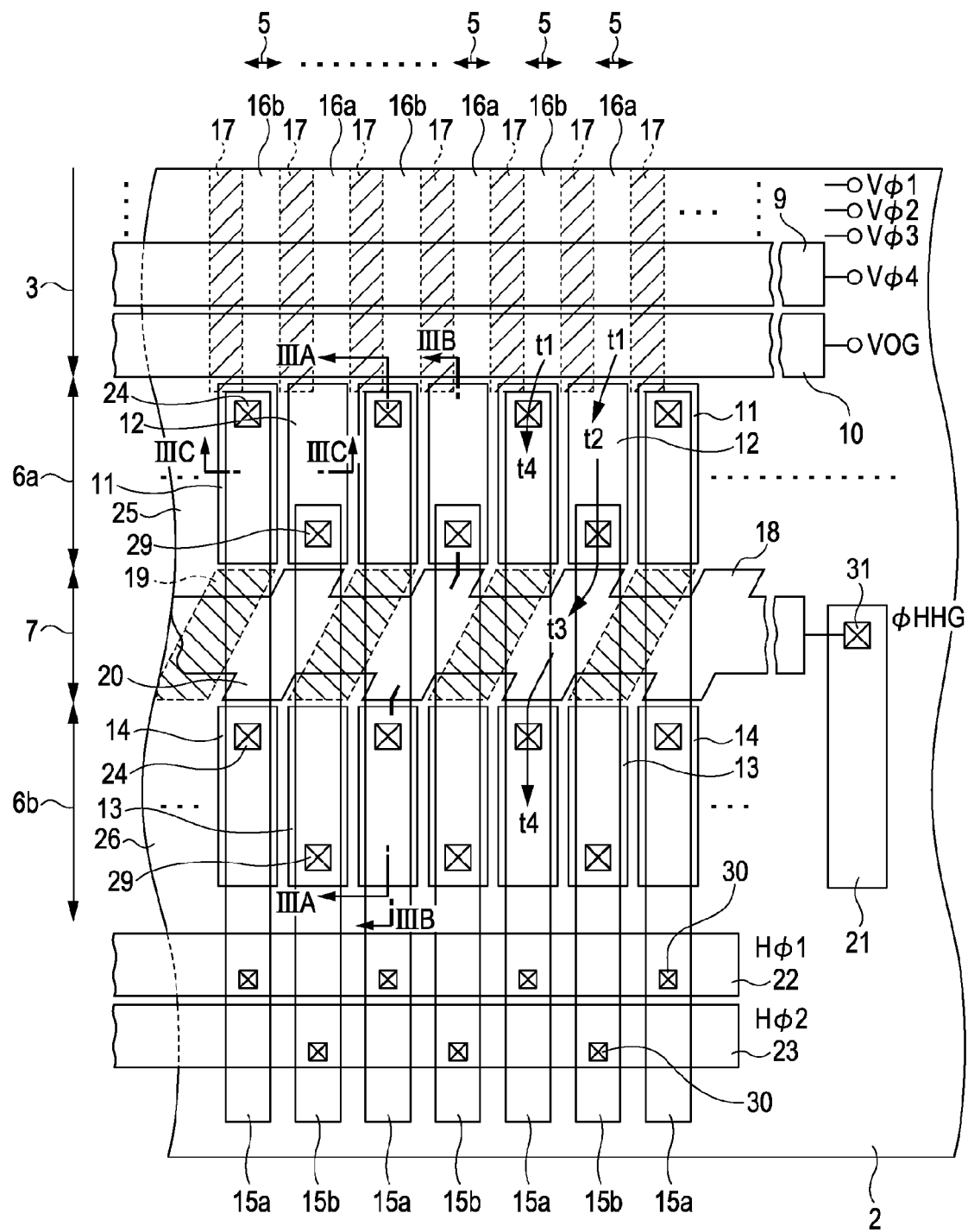
FIG. 2 is a schematic view of principal part of the solid-state imaging device according to the embodiment of the present invention.
Figure 3A:
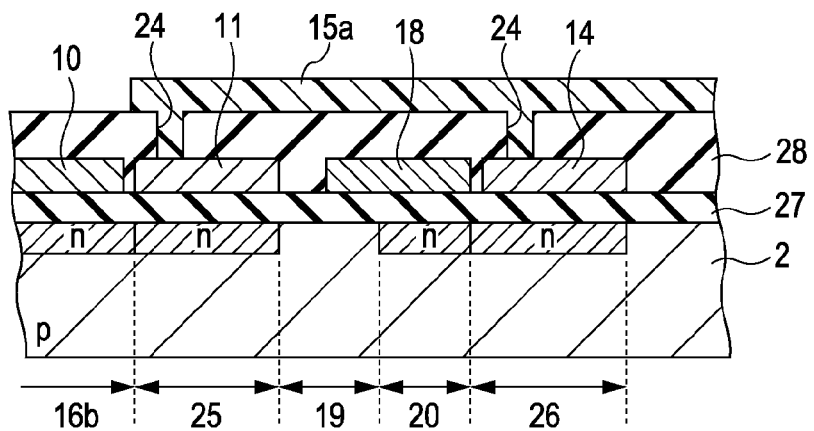
FIGS. 3A, 3B and 3C are schematic sectional views taken respectively along lines IIIA-IIIA, IIIB-IIIB and IIIC-IIIC in FIG. 2.
Figure 3B:
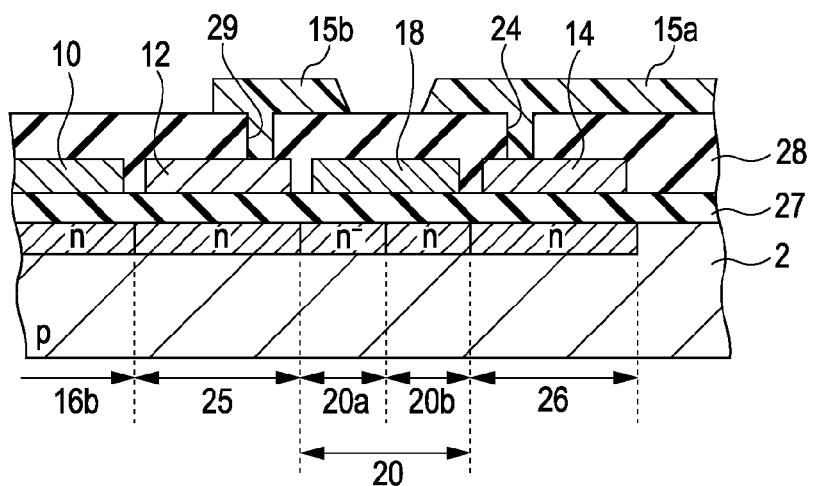
Figure 3C:
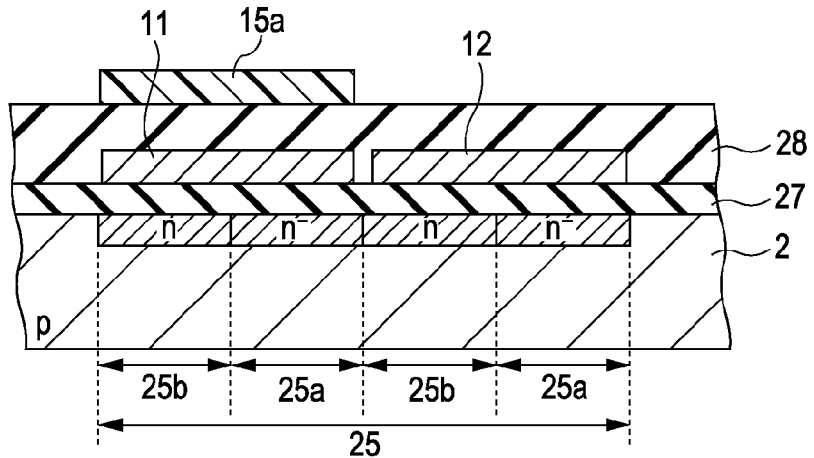

FIG. 2 illustrates the construction of the pixel section 3 including the vertical transfer registers 5 in respective final stages, the first horizontal transfer register 6a, the second horizontal transfer register 6b, and the H-H transfer portion 7 in the solid-state imaging device 1 according to the embodiment. FIG. 3A is a schematic sectional view taken along a line IIIA-IIIA in FIG. 2, FIG. 3B is a schematic sectional view taken along a line IIIB-IIIB in FIG. 2, and FIG. 3C is a schematic sectional view taken along a line IIIC-IIIC in FIG. 2. Principal part of the solid-state imaging device 1 according to the embodiment will be described in detail below with reference to FIGS. 2 and 3.

First, the vertical transfer registers 5 are described. As illustrated in FIGS. 2, 3A and 3B, the vertical transfer registers 5 include vertical transfer channel regions 16A and 16B provided by n-type impurity regions which are formed in the surface of the substrate 2 made of a p-type semiconductor, and vertical transfer electrodes 9 (10). The vertical transfer channel regions 16a and 16b are each formed in plural columns to extend in the vertical direction between the columns of the light receiving sensors 4 which are formed adjacent to each other in the horizontal direction. The vertical transfer channel regions 16a and 16b are alternately formed in a state separated per column by channel stop regions 17 which are made of the p-type semiconductor forming the substrate 2. The vertical transfer electrodes 9 (10) are formed on the substrate 2 to extend in the horizontal direction, in which the light receiving sensors 4, the vertical transfer channel regions 16a and 16b, and the channel stop regions 17 are formed. FIG. 2 illustrates the vertical transfer registers 5 including the vertical transfer electrode 10 for the final stage and the vertical transfer electrode 9 positioned preceding the vertical transfer electrode 10. The light receiving sensors 4 are not illustrated in FIG. 2.

The first horizontal transfer register 6a is next described.

The first horizontal transfer register 6a includes a first horizontal transfer channel region 25, a first horizontal transfer electrode 11, a second horizontal transfer electrode 12, a first shunt line 15a, and a second shunt line 15b, which are formed in and on the substrate 2.

As illustrated in FIG. 3C, the first horizontal transfer channel region 25 includes an n$^-$-type impurity region and an n-type impurity region, which are alternately formed in the horizontal direction in the surface of the substrate 2 made of the p-type semiconductor. The n$^-$-type impurity region forms a transfer region 25a in the first horizontal transfer channel region 25, and the n-type impurity region forms a storage region 25b in the first horizontal transfer channel region 25. The transfer region 25a has a relatively shallow electrostatic potential, and the storage region 25b has a relatively deep electrostatic potential. Therefore, the signal charges having been transferred to the first horizontal transfer channel region 25 is held in the storage region 25b.

One set of the transfer region 25a and the storage region 25b is connected to one vertical transfer channel region 16a (or 16b) which is positioned adjacent to the corresponding set.

The first horizontal transfer electrode 11 and the second horizontal transfer electrode 12 are alternately formed on the surface of the substrate 2 with a gate insulating film 27 interposed therebetween in a one-to-one relation to one set of the transfer region 25a and the storage region 25b in the first horizontal transfer channel region 25, which are adjacent to each other in the transfer direction. Further, the transfer region 25a and the storage region 25b both positioned under the first horizontal transfer electrode 11 are connected to the vertical transfer channel region 16b, while the transfer region 25a and the storage region 25b both positioned under the second horizontal transfer electrode 12 are connected to the vertical transfer channel region 16a.

The first horizontal transfer electrode 11 and the second horizontal transfer electrode 12 are each formed of a polysilicon layer.

As illustrated in FIG. 3A, the first shunt line 15a is formed on an insulating film 28 which is formed on the first horizontal transfer electrode 11, and it is electrically connected to the first horizontal transfer electrode 11 through a contact portion 24 which is formed in the insulating film 28. The first shunt line 15a is connected to a first metal line 22 through a contact portion 30. The first metal line 22 serves as a line for supplying the transfer drive pulse Hφ1. With such an arrangement, the transfer drive pulse Hφ1 is supplied to the first horizontal transfer electrode 11 through the first shunt line 15a.

As illustrated in FIG. 3B, the second shunt line 15b is formed on the insulating film 28 which is formed on the second horizontal transfer electrode 12, and it is electrically connected to the second horizontal transfer electrode 12 through a contact portion 29 which is formed in the insulating film 28. The second shunt line 15b is connected to a second metal line 23 through a contact portion 30. The second metal line 23 serves as a line for supplying the transfer drive pulse Hφ2. With such an arrangement, the transfer drive pulse Hφ2 is supplied to the second horizontal transfer electrode 12 through the second shunt line 15b.

Also, as illustrated in FIG. 3B, the first shunt line 15a and the second shunt line 15b are formed by different parts of the same polysilicon layer.

The second horizontal transfer register 6b is next described.

The second horizontal transfer register 6b is formed to extend parallel to the first horizontal transfer register 6a with the H-H transfer portion 7 interposed between the transfer registers 6b and 6a. The second horizontal transfer register 6b includes a second horizontal transfer channel region 26, a third horizontal transfer electrode 13, a fourth horizontal transfer electrode 14, a first shunt line 15a, and a second shunt line 15b, which are formed in and on the substrate 2.

As with the first horizontal transfer channel region 25, the second horizontal transfer channel region 26 includes an n⁻-type impurity region and an n-type impurity region, which are alternately formed in the horizontal direction in the surface of the substrate 2 made of the p-type semiconductor. The n⁻-type impurity region forms a transfer region 26a in the second horizontal transfer channel region 26, and the n-type impurity region forms a storage region 26b in the second horizontal transfer channel region 26. The transfer region 26a and the storage region 26b are formed adjacent respectively to the transfer region 25a and the storage region 25b of the first horizontal transfer channel region 25 in the vertical direction.

The third horizontal transfer electrode 13 and the fourth horizontal transfer electrode 14 are alternately formed on the surface of the substrate 2 with the gate insulating film 27 interposed therebetween in a one-to-one relation to one set of the transfer region 26a and the storage region 26b in the second horizontal transfer channel region 26, which are adjacent to each other in the transfer direction. Further, the third horizontal transfer electrode 13 is formed to locate in a vertically spaced relation to the second horizontal transfer electrode 12 as viewed in FIG. 2. Also, the fourth horizontal transfer electrode 14 is formed to locate in a vertically spaced relation to the first horizontal transfer electrode 11 as viewed in FIG. 2.

The third horizontal transfer electrode 13 and the fourth horizontal transfer electrode 14 are formed, as seen from FIGS. 3A and 3B, in the same polysilicon layer as the first horizontal transfer electrode 11 and the second horizontal transfer electrode 12.

As illustrated in FIG. 3A, the first shunt line 15a is formed on the insulating film 28 coated over the fourth horizontal transfer electrode 14 which is positioned spaced-apart adjacent to the first horizontal transfer electrode 11 in the vertical direction as viewed in FIG. 2. The first shunt line 15a is electrically connected to the fourth horizontal transfer electrode 14 through a contact portion 24 which is formed in the insulating film 28. More specifically, the first shunt line 15a is formed to extend in the vertical direction, as viewed in FIG. 2, in the integral form with the first shunt line 15a above the first horizontal transfer electrode 11, thus covering the first horizontal transfer electrode 11 and the fourth horizontal transfer electrode 14 which is positioned spaced-apart adjacent to the first horizontal transfer electrode 11 in the vertical direction as viewed in FIG. 2.

In other words, the first shunt line 15a serves to apply the transfer drive pulse Hφ1 to the first horizontal transfer electrode 11 and to apply the transfer drive pulse Hφ1 to the fourth horizontal transfer electrode 14 as well.

As seen from in FIGS. 2 and 3B, the second shunt line 15b is formed on the insulating film 28 coated over the third horizontal transfer electrode 13 which is positioned spaced-apart adjacent to the second horizontal transfer electrode 12 in the vertical direction as viewed in FIG. 2. The second shunt line 15b is electrically connected to the third horizontal transfer electrode 13 through a contact portion 29 which is formed in the insulating film 28. More specifically, the second shunt line 15b is formed to extend in the vertical direction, as viewed in FIG. 2, in the integral form with the second shunt line 15b above the second horizontal transfer electrode 12, thus covering the second horizontal transfer electrode 12 and the third horizontal transfer electrode 13 which is positioned spaced-apart adjacent to the second horizontal transfer electrode 12 in the vertical direction as viewed in FIG. 2.

In other words, the second shunt line 15b serves to apply the transfer drive pulse Hφ2 to the second horizontal transfer electrode 12 and to apply the transfer drive pulse Hφ2 to the third horizontal transfer electrode 13 as well.

As described above, the first shunt line 15a is formed to extend in a covering relation to the first horizontal transfer electrode 11 and the fourth horizontal transfer electrode 14 which are positioned spaced-apart adjacent to each other in the vertical direction as viewed in FIG. 2, and the second shunt line 15b is formed to extend in a covering relation to the second horizontal transfer electrode 12 and the third horizontal transfer electrode 13 which are positioned spaced-apart adjacent to each other in the vertical direction as viewed in FIG. 2. With such an arrangement, the first shunt line 15a and the second shunt line 15b are each formed in a state not spreading over the horizontal transfer electrodes to which the transfer drive pulses having different phases are applied.

The H-H transfer portion 7 is next described.

The H-H transfer portion 7 is formed between the first horizontal transfer register 6a and the second horizontal transfer register 6b. As illustrated in FIGS. 2, 3A and 3B, the H-H transfer portion 7 includes a horizontal-to-horizontal channel region (hereinafter referred to as an "H-H channel region") 20 and a channel stop region 19 which are formed in the substrate 2, and a horizontal-to-horizontal transfer electrode (hereinafter referred to as an "H-H transfer electrode") 18 which is formed on the surface of the substrate 2.

The H-H channel region 20 is formed between the first horizontal transfer register 6a and the second horizontal transfer register 6b so as to interconnect part of the first horizontal transfer channel region 25 positioned under the second horizontal transfer electrode 12 and part of the second horizontal transfer channel region 26 positioned under the fourth horizontal transfer electrode 14. Because the second horizontal transfer electrode 12 and the fourth horizontal transfer electrode 14 are spaced-apart adjacent to each other in an oblique relation, the H-H channel region 20 is also formed to extend obliquely.

Stated another way, in this embodiment, the transfer drive pulses having different phases are applied to the second horizontal transfer electrode 12 and the fourth horizontal transfer electrode 14. Therefore, the H-H channel region 20 is formed so as to interconnect part of the first horizontal transfer channel region 25 positioned under the second horizontal transfer electrode 12 and part of the second horizontal transfer channel region 26 positioned under the fourth horizontal transfer electrode 14, the electrodes 12 and 14 being supplied with the transfer drive pulses having different phases.

Further, as illustrated in FIG. 3B, the H-H channel region 20 includes a transfer region 20a made of an n⁻-type impurity region and a storage region 20b made of an n-type impurity region, which are successively formed in a direction from the first horizontal transfer register 6a toward the second horizontal transfer register 6b. With such an arrangement, the H-H channel region 20 has an electrostatic potential formed so as to become deeper in the direction from the first horizontal transfer register 6a toward the second horizontal transfer register 6b. The other part of the H-H channel region 20 than that positioned under the H-H transfer electrode 18 is formed as the channel stop region 109 made of the p-type semiconductor.

The H-H transfer electrode 18 is formed on the H-H channel region 20, which is formed in the substrate 2, while the gate insulating film 27 formed on the surface of the substrate 2 is interposed between them, such that a single member of the H-H transfer electrode 18 extends over a plurality of H-H channel regions 20 formed side by side in the horizontal direction. Further, as illustrated in FIGS. 3A and 3B, the H-H transfer electrode 18 is formed in the same polysilicon layer as the first to fourth transfer electrodes 11 to 14. The H-H transfer electrode 18 is connected to a metal wire 21 through a contact portion 31. The metal line 21 serves to supply a transfer drive pulse φHHG to the H-H transfer electrode 18.

Thus, in this embodiment, the vertical transfer electrode 9 (10), the first to fourth horizontal transfer electrodes 11 to 14, and the H-H transfer electrode 18 are formed by different parts of the same polysilicon layer. Also, the first shunt line 15a and the second shunt line 15b are formed above those electrodes by different parts of the same polysilicon layer. Stated another way, in the solid-state imaging device 1 according to the embodiment, each of the first horizontal transfer register 6a and the second horizontal transfer register 6b has electrode layers formed as two polysilicon layers.

[Method of Manufacturing Solid-State Imaging Device]

Figure 4A:
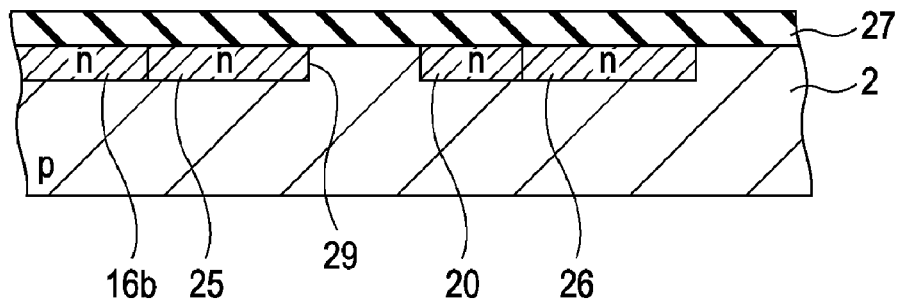
FIGS. 4A, 4B and 4C illustrate a first series of successive manufacturing steps for the solid-state imaging device according to the embodiment of the present invention.
Figure 4B:
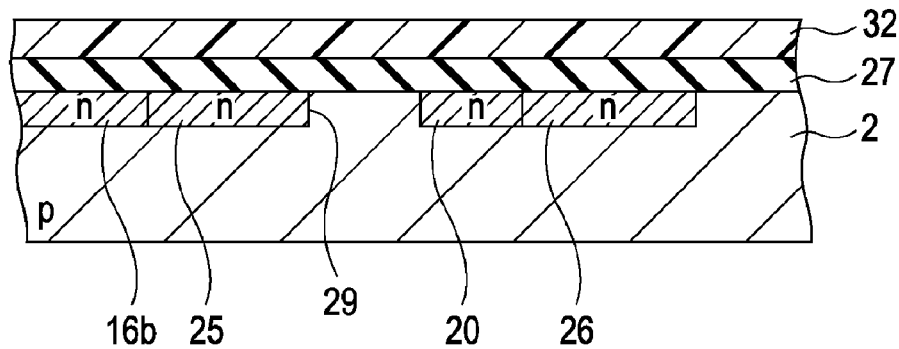
Figure 4C:
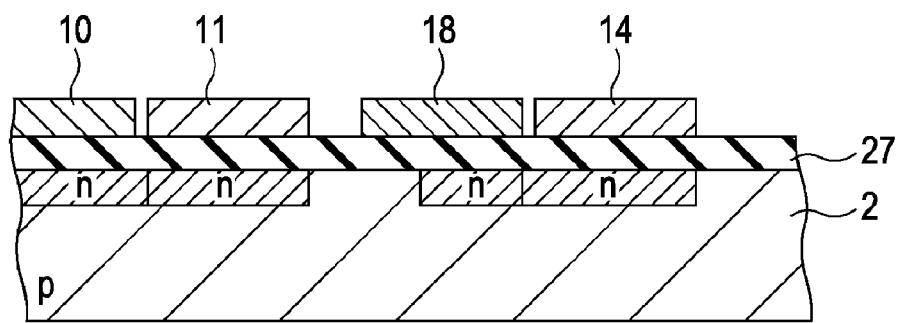

A method of manufacturing the solid-state imaging device 1 according to the embodiment will be described below with reference to FIGS. 4A, 4B and 4C. FIGS. 4A, 4B and 4C illustrate successive manufacturing steps for a sectional area taken along the line IIIA-IIIA in FIG. 2.

First, as illustrated in FIG. 4A, the vertical transfer channel region 16b (16a), the first horizontal transfer channel region 25, the second horizontal transfer channel region 26, the H-H channel region 20, and the channel stop region (not shown) are formed in the substrate 2, i.e., the p-type semiconductor made of silicon. The vertical transfer channel region 16b (16a), the first horizontal transfer channel region 25, the second horizontal transfer channel region 26, and the H-H channel region 20 can be formed by injecting n-type impurity ions at respective predetermined positions. Then, the gate insulating film 27 made of a silicon oxide is formed on the surface of the substrate 2.

Next, as illustrated in FIG. 4B, a first polysilicon layer 32 serving as an electrode material layer is formed on the gate insulting film 27.

Next, as illustrated in FIG. 4C, the vertical transfer electrode 10 (9), the first to fourth horizontal transfer electrodes 11 to 14, and the H-H transfer electrode 18 are formed by patterning the polysilicon layer 32. In other words, the vertical transfer electrode 9 (10), the first to fourth horizontal transfer electrodes 11 to 14, and the H-H transfer electrode 18 are formed in the first polysilicon layer 32.

Figure 4D:
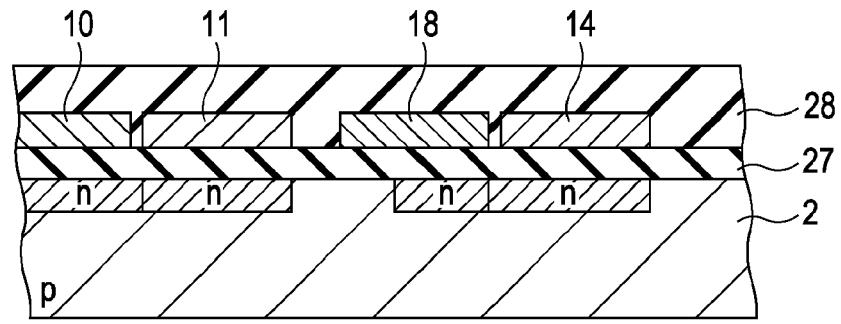
FIGS. 4D, 4E and 4F illustrate a second series of successive manufacturing steps for the solid-state imaging device according to the embodiment of the present invention.

Next, as illustrated in FIG. 4D, the insulating film 28 is formed on the vertical transfer electrode 10 (9), the first to fourth horizontal transfer electrodes 11 to 14, and the H-H transfer electrode 18, as well as on gap regions between those electrodes by the CVD (Chemical Vapor Deposition) process. The insulating film 28 can be formed as not only a single-layer film of oxide silicon ($SiO_2$), silicon nitride (SiN), or silicon oxynitride (SiON), but also a multilayered film in combination of those single-layer films.

Figure 4E:
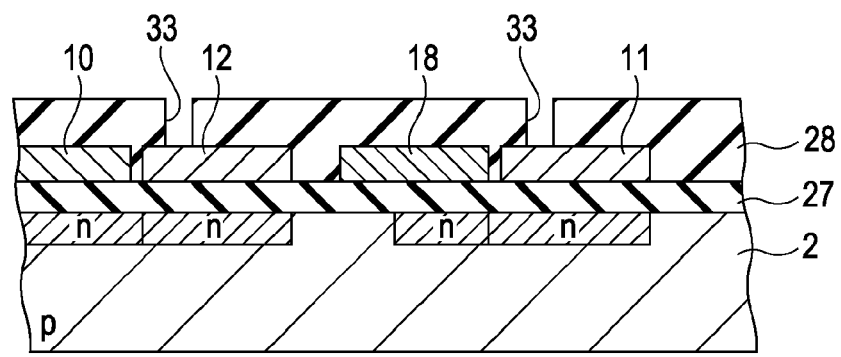

Next, as illustrated in FIG. 4E, contact holes 33 are formed at desired positions of the insulating film 28 coated over the first to fourth horizontal transfer electrodes 11 to 14. The contact holes 33 constitute the contact portions 24 and 29 in FIGS. 3A and 3B.

Figure 4F:
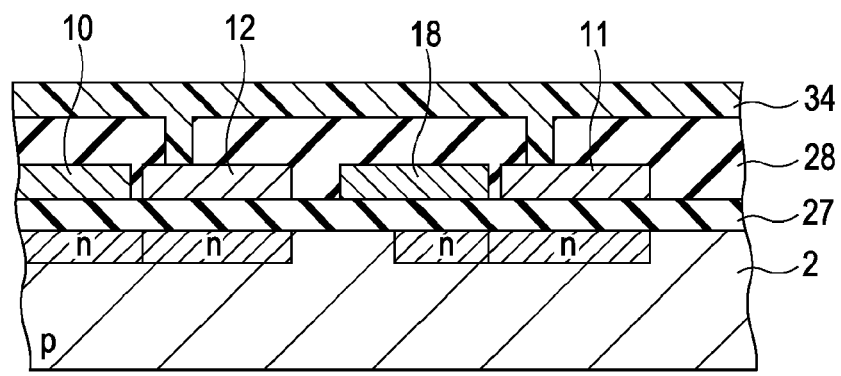

Next, as illustrated in FIG. 4F, a second polysilicon layer 34 serving as an electrode material layer is formed in the contact holes 33 and on the insulating film 28.

Next, as illustrated in FIGS. 3A and 3B, the first shunt line 15a and the second shunt line 15b are formed by patterning the second polysilicon layer 34. In other words, the first shunt lines 15a and the second shunt lines 15b are formed by respective parts of the second polysilicon layer 34.

Subsequent manufacturing processes are the same as those in manufacturing the ordinary CCD solid-state imaging device, and include a process of forming an interlayer insulating film and a process of forming a light-shield electrode. The subsequent manufacturing processes further include a process of forming source and drain regions, and a process of forming the metal lines. In the process of forming the metal lines, contacts portions for interconnecting the respective metal lines with the first shunt lines 15a, with the second shunt lines 15b, and with lines connected to the H-H transfer electrode 18 are formed, thus providing electrical contacts between the metal lines and the other lines. Thereafter, a color filter layer and an on-chip lens are formed, if necessary, whereby the solid-state imaging device 1 is completed.

With the method of manufacturing the solid-state imaging device 1 according to the embodiment, since the first polysilicon 32 is used to form the vertical transfer electrode 10 (9), the first to fourth horizontal transfer electrodes 11 to 14, and the H-H transfer electrode 18, the multilayered polysilicon electrode structure and steps of forming that structure are no longer necessary. As a result, the number of steps necessary in the manufacturing method can be reduced.

[Method of Driving Solid-State Imaging Device]

Figure 5:
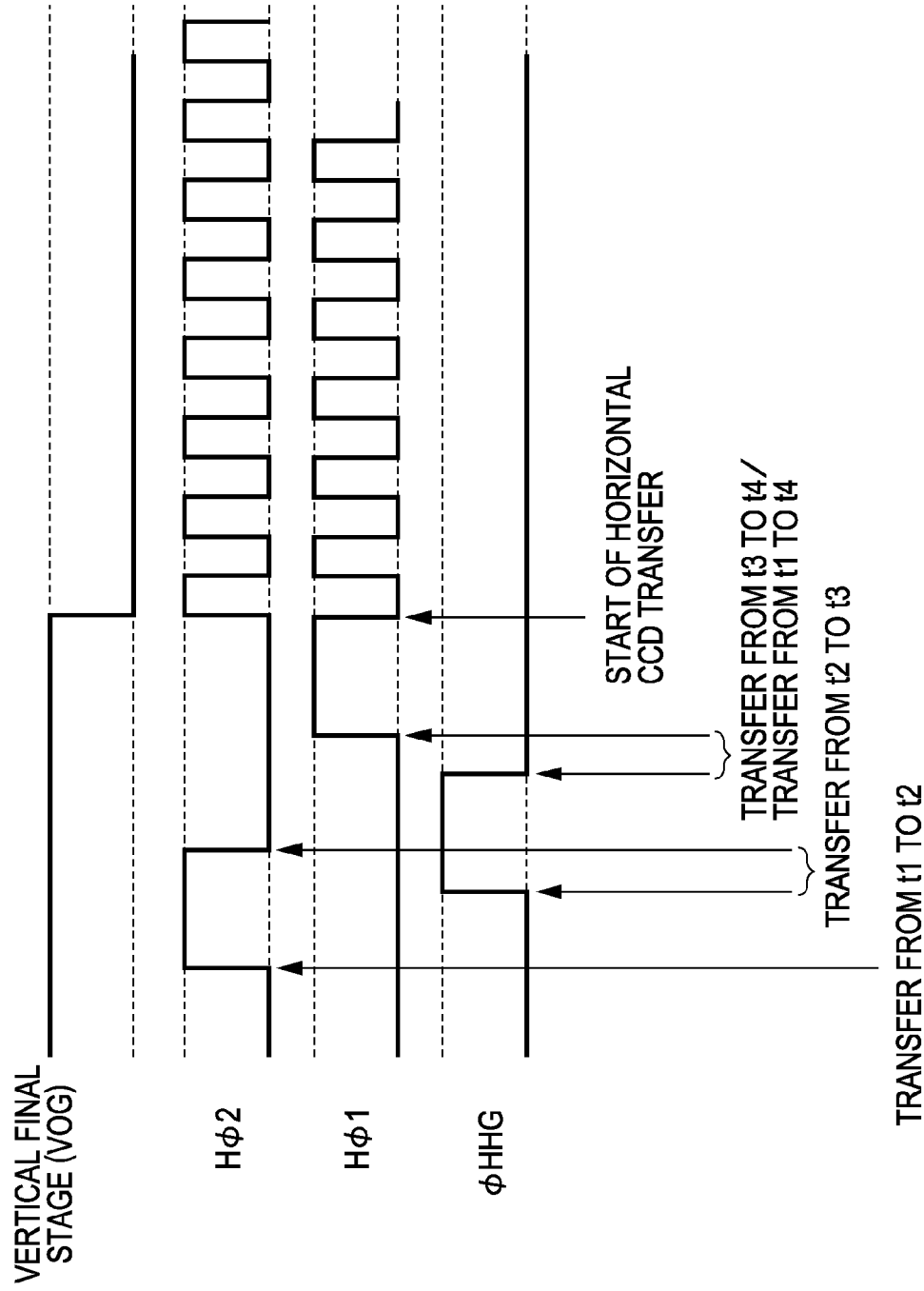
FIG. 5 is a timing chart for a vertical transfer register in a final stage and horizontal transfer registers.
Figure 6:
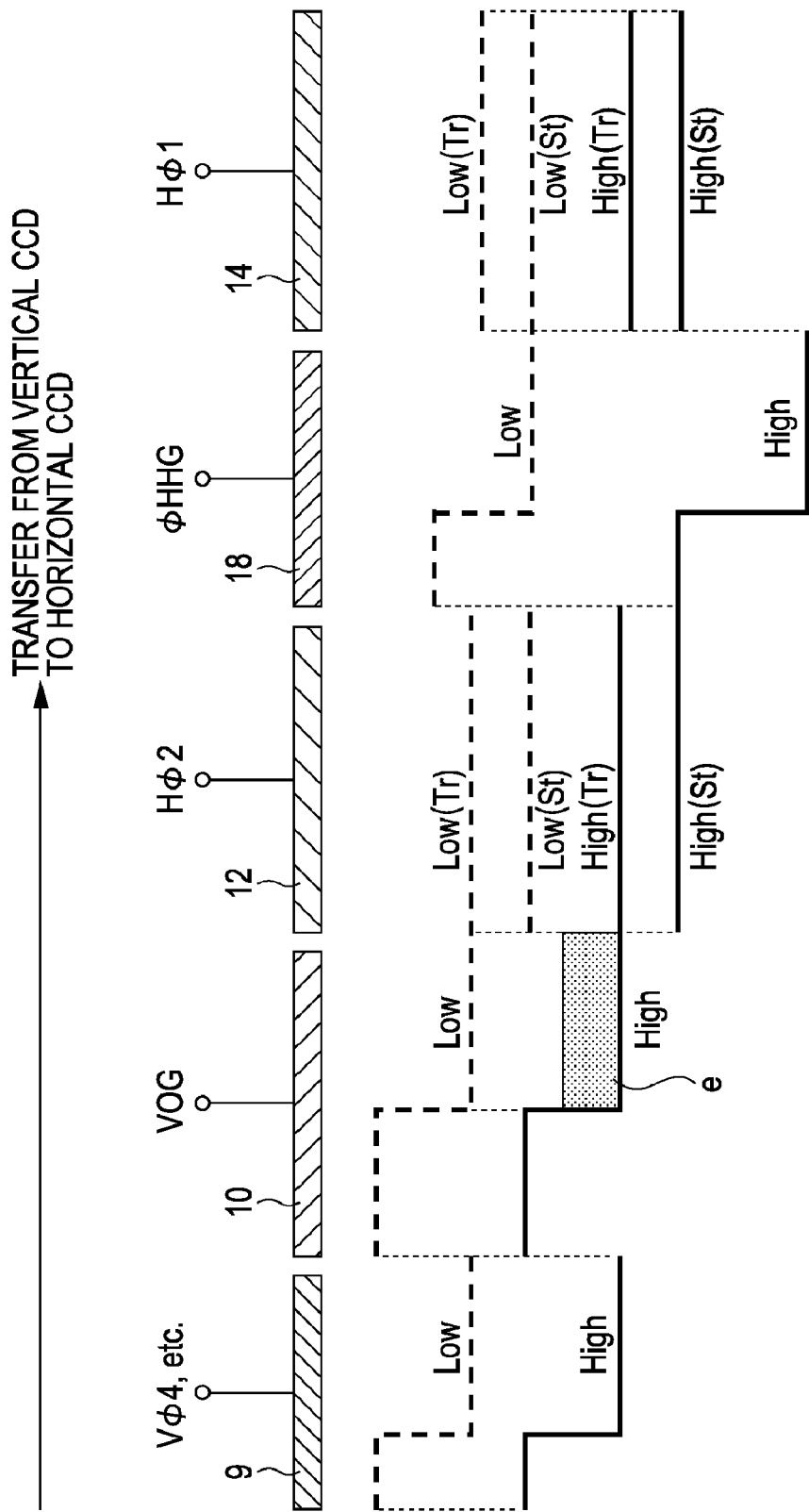
FIG. 6 illustrates potentials in primary areas in the solid-state imaging device according to the embodiment of the present invention.

A method of driving the solid-state imaging device 1 according to the embodiment will be described below. FIG. 5 is a timing chart of the transfer drive pulses applied to the vertical transfer electrode 10 for the final stage, the first to fourth horizontal transfer electrodes 11 to 14, and the H-H transfer electrode 18. FIG. 6 illustrates potentials in respective regions, taken along the line IIIB-IIIB, corresponding to the applied transfer drive pulses. FIG. 6 further illustrates potentials in respective regions taken along the line IIIA-IIIA and in the vertical transfer channel region 16a under the vertical transfer electrode 9 in the stage preceding the final stage.

In the potential diagram of FIG. 6, a solid line represents a potential at a high level (High) when the transfer drive pulse is applied, and a broken line represents a potential at a low level (Low) when the transfer drive pulse is not applied. Further, since the transfer regions 25a and 26a and the storage regions 25b and 26b are alternately formed in the horizontal direction in the first horizontal transfer channel region 25 and the second horizontal transfer channel region 26, respectively, potentials in the transfer regions and the storage regions are also denoted by High (Tr, St) and Low (Tr, St).

First, as illustrated in FIG. 5, the transfer drive pulse Hϕ2 is applied in a state where the transfer drive pulse VOG is applied to the vertical transfer electrode 10 of the vertical transfer register 5 in the final stage. With the application of those transfer drive pulses, the potential in the part of the first horizontal transfer channel region 25 positioned under the second horizontal transfer electrode 12 turns to a high level in a state where the potential in the part of the vertical transfer channel region 16a positioned under the vertical transfer electrode 10 for the final stage is held at a high level. Accordingly, as illustrated in FIG. 6, the potential in the part of the first horizontal transfer channel region 25 positioned under the second horizontal transfer electrode 12 becomes deeper than the potential in the vertical transfer channel region 16a. As a result, signal charges e held in the vertical transfer channel region 16a in the final stage are transferred to the part of the first horizontal transfer channel region 25 positioned under the second horizontal transfer electrode 12. Thus, at that timing, the signal charges e are transferred from t1 to t2 as illustrated in FIG. 2.

Then, the transfer drive pulse ϕHHG is applied to the H-H channel region 20 while the application of the transfer drive pulse Hϕ2 is stopped. With such switching in the application of the transfer drive pulses, the potential in the H-H channel region 20 turns from a low level to a high level while the potential in the part of the first horizontal transfer channel region 25 positioned under the second horizontal transfer electrode 12 turns to a low level. Accordingly, as illustrated in FIG. 6, the potential in the H-H channel region 20 becomes deeper than that in the part of the first horizontal transfer channel region 25 positioned under the second horizontal transfer electrode 12. As a result, the signal charges e held in the part of the first horizontal transfer channel region 25 positioned under the second horizontal transfer electrode 12 are transferred to the H-H channel region 20. Thus, at that timing, the signal charges e are transferred from t2 to t3 as illustrated in FIG. 2.

At that time, because the H-H channel region 20 has the transfer region and the storage region which are formed side by side in the transfer direction, a step-like potential is formed in the H-H channel region 20 to have different levels in the transfer direction, as illustrated in FIG. 6, such that the signal charges are prevented from flowing backward.

Then, the application of the transfer drive pulse ϕHHG to the H-H transfer electrode 18 is stopped and the transfer drive pulse Hϕ1 is applied. With such switching in the application of the transfer drive pulses, the potential in the H-H channel region 20 turns to a low level and the potential in the part of the second horizontal transfer channel region 26 positioned under the fourth horizontal transfer electrode 14 turns to a high level. Accordingly, as illustrated in FIG. 6, the potential in the part of the second horizontal transfer channel region 26 positioned under the fourth horizontal transfer electrode 14 becomes deeper than the potential in the H-H channel region 20. As a result, the signal charges e held in the H-H channel region 20 are transferred to the part of the second horizontal transfer channel region 26 positioned under the fourth horizontal transfer electrode 14. Thus, at that timing, the signal charges e are transferred from t3 to t4 as illustrated in FIG. 2.

Further, at that time, the potential in the part of the first horizontal transfer channel region 25 positioned under the first horizontal transfer electrode 11 turns to a high level in the state where the potential in the part of the vertical transfer channel region 16b positioned under the vertical transfer electrode 10 for the final stage is held at the high level. Accordingly, as illustrated in FIG. 6, the potential in the part of the first horizontal transfer channel region 25 positioned under the first horizontal transfer electrode 11 becomes deeper than the potential in the vertical transfer channel region 16b. As a result, signal charges e held in the vertical transfer channel region 16b in the final stage are transferred to the part of the first horizontal transfer channel region 25 positioned under the first horizontal transfer electrode 11. Thus, the signal charges e held in the vertical transfer channel region 16b are transferred from t1 to t4, as illustrated in FIG. 2, at the same timing as when the signal charges e are transferred from t3 to t4.

Thereafter, the application of the transfer drive pulse VOG to the vertical transfer electrode 10 for the final stage is stopped and the transfer drive pulses Hϕ1 and Hϕ2 are alternately applied. With the alternate application of the transfer drive pulses Hϕ1 and Hϕ2, the signal charges e held in the part of the second horizontal transfer channel region 26 positioned under the fourth horizontal transfer electrode 14 are successively transferred in the horizontal direction in the second horizontal transfer register 6b.

At that time, since the signal charges held in the part of the first horizontal transfer channel region 25 positioned under the second horizontal transfer electrode 12 have been transferred to the part of the second horizontal transfer channel region 26 positioned under the fourth horizontal transfer electrode 14 through the H-H transfer portion 7, there are no signal charges under the second horizontal transfer electrode 12. However, the part of the first horizontal transfer channel region 25 positioned under the first horizontal transfer electrode 11, which is adjacent to the second horizontal transfer electrode 12, is in the state where the signal charges having been transferred from the vertical transfer channel region 16b are held. In the first horizontal transfer register 6a, therefore, the signal charges e held in the part of the first horizontal transfer channel region 25 positioned under the first horizontal transfer electrode 11 is successively transferred.

As described above, the signal charges having been transferred through the vertical transfer channel regions 16a and 16b are transferred in the horizontal direction by the first horizontal transfer register 6a and the second horizontal transfer register 6b and are output as video signals through the output circuits 8a and 8b, respectively.

In the solid-state imaging device 1 according to the embodiment, the parts of the first and second horizontal transfer channel regions 25 and 26 positioned under the first to fourth horizontal transfer electrodes 11 to 14 include respectively the transfer regions 25a and 26a and the storage regions 25b and 26b. Therefore, the first horizontal transfer register 6a and the second horizontal transfer register 6b can be 2-phase driven by using the transfer drive pulses Hϕ1 and Hϕ2. Further, since one set of the transfer region and the storage region is formed under one horizontal transfer electrode to which the transfer drive pulse having the same phase is applied, an in-phase electric field for transfer in the horizontal direction is enhanced.

In the multilayered polysilicon electrode structure of the related art, the thickness of the interlayer insulating film is necessarily increased between the H-H transfer electrode formed by the first polysilicon layer and the horizontal transfer electrode formed by the third polysilicon layer. In the ordinary solid-state imaging device, therefore, transfer between the transfer stage using the first polysilicon layer and the transfer stage using the third polysilicon layer tends to malfunction during the low-voltage driving.

In contrast, the solid-state imaging device 1 according to the embodiment has no thick interlayer insulating film and is suitable for the low-voltage driving because the vertical transfer electrode 9 (10), the horizontal transfer electrodes, and the H-H transfer electrode are formed by respective parts of the same polysilicon layer 32.

Also, in the related-art multilayered polysilicon electrode structure having three layers, for example, the gate structure is complicated because of the necessity of employing a MONOS structure to keep the thickness of the gate insulating film constant per transfer stage.

In contrast, the solid-state imaging device 1 according to the embodiment can be formed by using the single gate insulating film 27 because the vertical transfer electrode 9 (10), the first to fourth horizontal transfer electrodes 11 to 14, and the H-H transfer electrode 18 can be formed in the same polysilicon layer 32.

Further, the related-art multilayered polysilicon electrode structure having three layers, for example, has high necessity of using a method of forming the interlayer insulating film by oxidizing polysilicon in order to keep the thickness of the gate insulating film constant per transfer stage. Such a method necessarily causes narrowing of a polysilicon electrode due to oxidation thereof. The narrowing of the polysilicon electrode due to oxidation thereof is not desirable from the viewpoint of reducing the pixel size. Particularly, the narrowing of the polysilicon electrode formed by the first polysilicon layer is not desirable in point of deteriorating the photolithographic accuracy.

In contrast, with the method of manufacturing the solid-state imaging device according to the embodiment, since the vertical transfer electrode 10 (9), the first to fourth horizontal transfer electrodes 11 to 14, and the H-H transfer electrode 18 are formed in the single polysilicon layer 32, oxidation generating on those electrodes can be made substantially zero. Thus, the structure of the solid-state imaging device 1 and the method of manufacturing the solid-state imaging device 1, according to the embodiment, are suitable for further miniaturization of a device.

Still further, in the related-art multilayered polysilicon electrode structure having three layers, for example, the horizontal transfer electrodes are formed in a mutually overlapped relation and parasitic capacitance is generated between the horizontal transfer electrodes. In addition, because the horizontal transfer electrodes and the H-H transfer electrode are also formed in a mutually overlapped relation, parasitic capacitance is generated between the horizontal transfer electrodes and the H-H transfer electrode as well.

In contrast, in the solid-state imaging device 1 according to the embodiment, since the first to fourth horizontal transfer electrodes 11 to 14 and the H-H transfer electrode 18 are all formed in the same polysilicon layer in a separated state, those electrodes are not mutually overlapped with each other. As a result, parasitic capacitance can be reduced between the first to fourth horizontal transfer electrodes 11 to 14 and the H-H transfer electrode 18, and drivability in operating the first and second horizontal transfer registers 6a and 6b can be improved.

Moreover, in the solid-state imaging device 1 according to the embodiment, the first and second shunt lines 15a and 15b are arranged such that they are not laid out above ones of the first to fourth horizontal transfer electrodes 11 to 14 to which the transfer drive pulses having different phases are applied. Such an arrangement can reduce the coupling capacitance between the horizontal transfer electrodes to which the transfer drive pulses having different phases are applied, and hence can realize driving with lower power consumption.

While the solid-state imaging device according to the embodiment has been described, by way of example, as driving the first horizontal transfer register and the second horizontal transfer register in 2 phases, those registers may be driven in 3 or 4 phases. Further, while the solid-state imaging device according to the embodiment has been described, by way of example, as including two horizontal transfer registers, i.e., the first horizontal transfer register and the second horizontal transfer register, three or more horizontal transfer registers may also be used. By employing the 2-phase driving of the first horizontal transfer register and the second horizontal transfer register as in the embodiment, however, the solid-state imaging device can be prevented from becoming complicated in the transfer drive pulses input to the registers, electrode wiring, channel regions, etc., and is relatively easy to handle. For that reason, the 2-phase driving of the first horizontal transfer register and the second horizontal transfer register is more desirable from the viewpoints of simpler construction and easier handling of the solid-state imaging device.

The embodiment can be applied to CCD solid-state imaging devices of IT (interline) type, FT (frame transfer) type, and FIT (frame interline transfer) type.

[Electronic Apparatus]

The case of applying the solid-state imaging device according to the above-described embodiment to an electronic apparatus will be described below as another embodiment of the present invention. In the following description, the solid-state imaging device 1 according to the embodiment is applied to a camera, for example.

Figure 7:
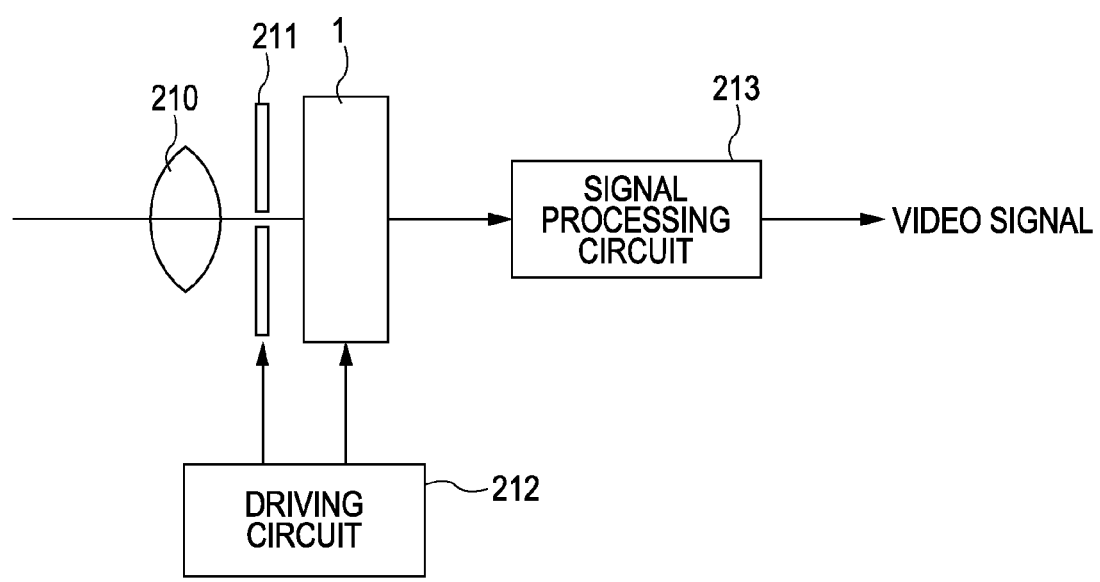
FIG. 7 illustrates an electronic apparatus according to another embodiment of the present invention.
Figure 8:
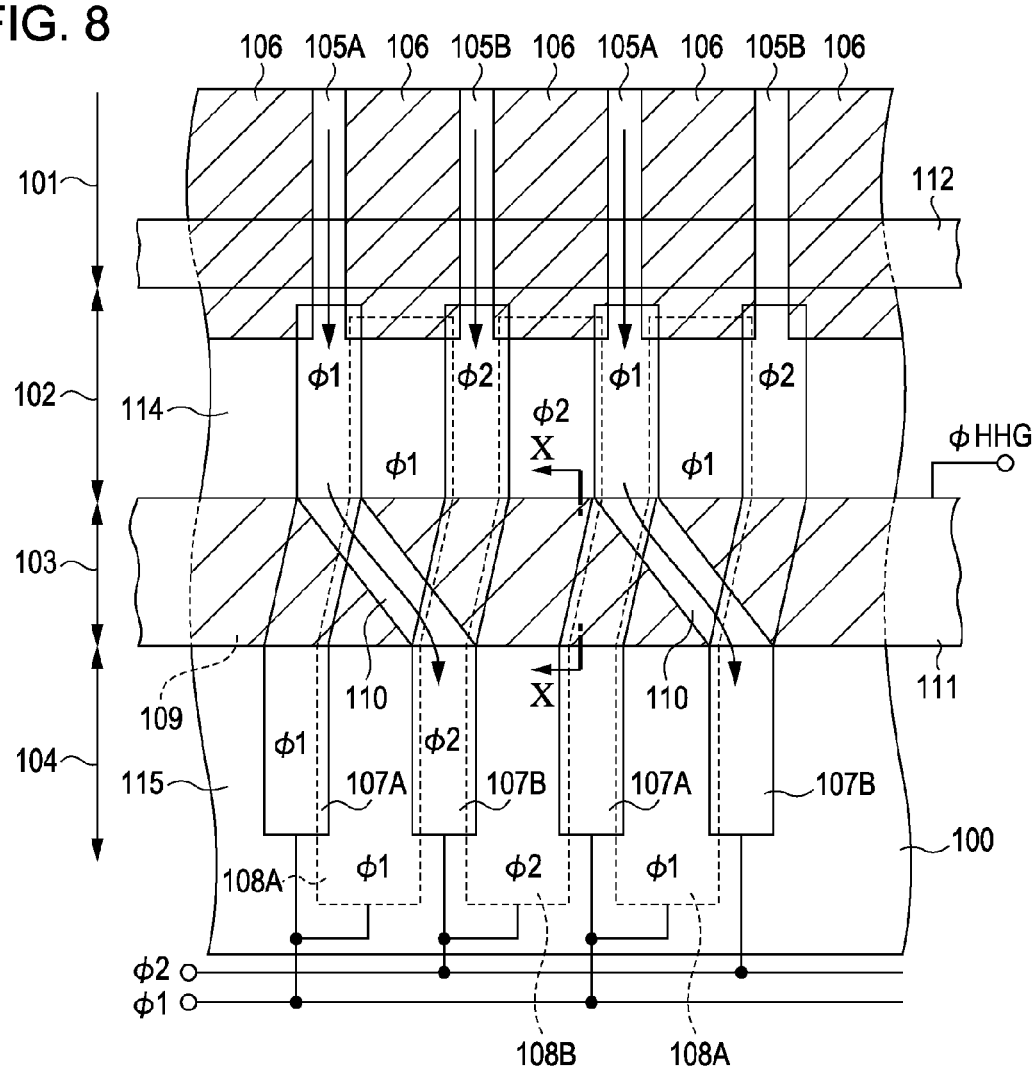
FIG. 8 is a schematic view of principal part of a solid-state imaging device according to the related art.
Figure 9:
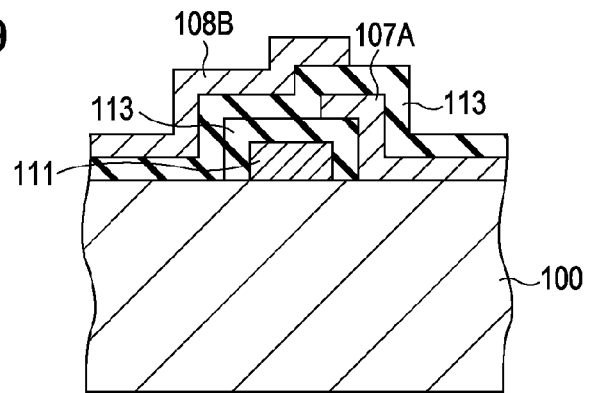
FIG. 9 is a sectional view taken along a line X-X in FIG. 8.

FIG. 7 illustrates, as a simplified layout in section, a camera (electronic apparatus) according to another embodiment of the present invention. The camera according to the other embodiment is, e.g., a video camera capable of shooting still images and/or moving images.

The camera according to the embodiment includes the solid-state imaging device 1, an optical system 210, a shutter device 211, a driving circuit 212, and a signal processing circuit 213.

The optical system 210 focuses image light (incident light) from a subject on an imaging area surface of the solid-state imaging device 1. Signal charges are thereby accumulated in the solid-state imaging device 1 for a certain period.

The shutter device 211 controls a period during which light is illuminated to the solid-state imaging device 1, and a period during which the light is cut.

The driving circuit 212 supplies drive signals for controlling the transfer operation in the solid-state imaging device 1 and the shutter operation of the shutter device 211. The signal transfer in the solid-state imaging device 1 is performed in accordance with the drive signals (timing signals) supplied from the driving circuit 212. The signal processing circuit 213 executes various types of signal processing. A video signal having being subjected to the signal processing is stored in a storage medium, such as a memory, or is output to a monitor.

Since the interlayer insulating film between the electrodes is formed in a smaller thickness in the solid-state imaging device 1, the electronic apparatus according to the other embodiment can be constructed as an electronic apparatus which is driven with lower power consumption.

The present application contains subject matter related to that disclosed in Japanese Priority Patent Application JP filed in the Japan Patent Office on Sep. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a pixel section including a plurality of light receiving sensors;
   a plurality of vertical transfer registers in a horizontally spaced relation including vertical transfer channel regions each between horizontally adjacent two of the light receiving sensors, and vertical transfer electrodes above the vertical transfer channel regions;
   a plurality of horizontal transfer registers in a vertically spaced relation, each horizontal transfer register including a horizontal transfer channel region and a plurality of horizontal transfer electrodes formed side by side in a horizontal direction above the horizontal transfer channel region and in the same layer as the vertical transfer electrodes, the horizontal transfer electrodes being arranged such that transfer drive pulses having different phases are applied to horizontally adjacent two of the horizontal transfer electrodes; and
   a horizontal-to-horizontal transfer portion between adjacent two of the horizontal transfer registers including a horizontal-to-horizontal transfer channel region interconnecting respective parts of the horizontal transfer channel regions under the horizontal transfer electrodes to which the transfer drive pulses having different phases are applied, and a horizontal-to-horizontal transfer electrode above the horizontal-to-horizontal transfer channel region in the same layer as both the vertical transfer electrodes and the horizontal transfer electrodes.

2. The solid-state imaging device according to claim 1, further comprising a plurality of shunt lines interconnecting the horizontal transfer electrodes, which are supplied with the transfer drive pulses having the same phase, between adjacent two of the horizontal transfer registers.

3. A solid-state imaging device comprising:
   a pixel section including a plurality of light receiving sensors;
   a plurality of vertical transfer registers in a horizontally spaced relation including vertical transfer channel regions each between horizontally adjacent two of the light receiving sensors, and vertical transfer electrodes above the vertical transfer channel regions;
   a first horizontal transfer register including a first horizontal transfer channel region, and including a first horizontal transfer electrode and a second horizontal transfer electrode which are alternately formed in a horizontal direction above the first horizontal transfer channel region and are supplied with transfer drive pulses having different phases;
   a second horizontal transfer register including a second horizontal transfer channel region, and including a third horizontal transfer electrode and a fourth horizontal transfer electrode which are alternately formed in the horizontal direction above the second horizontal transfer channel region, are in the same layer as the first and second horizontal transfer electrodes, and are supplied with transfer drive pulses having different phases; and
   a horizontal-to-horizontal transfer portion between the first horizontal transfer register and the second horizontal transfer register including a horizontal-to-horizontal transfer channel region interconnecting part of the first horizontal transfer channel region positioned under the second horizontal transfer electrode and part of the second horizontal transfer channel region under the fourth horizontal transfer electrode, which is supplied with the transfer drive pulse differing from the transfer drive pulse applied to the second horizontal transfer electrode, and a horizontal-to-horizontal transfer electrode above the horizontal-to-horizontal transfer channel region in the same layer as the first to fourth horizontal transfer electrodes.

4. The solid-state imaging device according to claim 3, further comprising:
   a first shunt line connected to the first horizontal transfer electrode and the fourth horizontal transfer electrode and applying the transfer drive pulses having the same phase to the first horizontal transfer electrode and the fourth horizontal transfer electrode; and
   a second shunt line in the same layer as the first shunt line, connected to the second horizontal transfer electrode and the third horizontal transfer electrode, and applying the transfer drive pulses having the same phase to the second horizontal transfer electrode and the third horizontal transfer electrode.

5. The solid-state imaging device according to claim 4, wherein:
   the vertical transfer electrodes, the first to fourth horizontal transfer electrodes, and the horizontal-to-horizontal transfer electrode are formed by a first polysilicon layer, and
   the first shunt line and the second shunt line are formed by a second polysilicon layer.

6. The solid-state imaging device according to claim 5, wherein:
   the first horizontal transfer electrode and the second horizontal transfer electrode are arranged respectively adjacent to the fourth horizontal transfer electrode and the third horizontal transfer electrode in a vertical direction, and
   the horizontal-to-horizontal transfer electrode is obliquely formed between part of the first horizontal transfer channel region under the second horizontal transfer electrode and part of the second horizontal transfer channel region under the fourth horizontal transfer electrode which is obliquely adjacent to the second horizontal transfer electrode.

7. The solid-state imaging device according to claim 6, wherein the first shunt line and the second shunt line are each arranged not to spread over those ones of the first to fourth horizontal transfer electrodes, which are supplied with the different transfer drive pulses.

8. The solid-state imaging device according to claim 7, wherein each of the first and second horizontal transfer channel regions includes a transfer region and a storage region which are formed side by side in a transfer direction of signal charges.

9. The solid-state imaging device according to claim 8, wherein the first to fourth horizontal transfer electrodes are each formed in a one-to-one relation to one set of the transfer region and the storage region.

10. The solid-state imaging device according to claim 9, wherein the horizontal-to-horizontal transfer channel region includes a transfer region and a storage region which are formed side by side in the transfer direction.

11. A method of manufacturing a solid-state imaging device, the method comprising the steps of:
    forming, in a substrate, a plurality of vertical transfer channel regions which are spaced-apart adjacent to each other in a horizontal direction;
    forming, in the substrate, a plurality of horizontal transfer channel regions which are spaced-apart adjacent to each other in a vertical direction;

forming a horizontal-to-horizontal transfer channel region between adjacent two of the horizontal transfer channel regions;

forming a first electrode material layer on the substrate;

patterning the first electrode material layer to form vertical transfer electrodes above the vertical transfer channel regions, a plurality of horizontal transfer electrodes arranged side by side in the horizontal direction above each of the horizontal transfer channel regions, and a horizontal-to-horizontal transfer electrode above the horizontal-to-horizontal transfer channel region;

forming a second electrode material layer on the vertical transfer channel regions, the plurality of horizontal transfer electrodes, and the horizontal-to-horizontal transfer electrode; and patterning the second electrode material layer to form a plurality of shunt lines each interconnecting those ones of the plurality of horizontal transfer electrodes formed above adjacent two of the horizontal transfer channel regions, which are supplied with transfer drive pulses having the same phase.

12. A method of manufacturing a solid-state imaging device, the method comprising the steps of:

forming vertical transfer channel regions, a first horizontal transfer channel region, a second horizontal transfer channel region, and a horizontal-to-horizontal transfer channel region in a substrate;

forming a first electrode material layer on the substrate;

patterning the first electrode material layer to form vertical transfer electrodes above the vertical transfer channel regions, a first horizontal transfer electrode and a second horizontal transfer electrode which are alternately arranged in a horizontal direction above the first horizontal transfer channel region, a third horizontal transfer electrode and a fourth horizontal transfer electrode which are alternately arranged in the horizontal direction above the second horizontal transfer channel region, and a horizontal-to-horizontal transfer electrode above the horizontal-to-horizontal transfer channel region, forming a second electrode material layer on an insulating film; and patterning the second electrode material layer to form a first shunt line interconnecting the first horizontal transfer electrode and the third horizontal transfer electrodes, and a second shunt line interconnecting the second horizontal transfer electrode and the fourth horizontal transfer electrode.

13. The method of manufacturing a solid-state imaging device according to claim 12, wherein the first shunt line and the second shunt line are supplied with transfer drive pulses having different phases.

14. An electronic apparatus comprising:

an optical lens;

a solid-state imaging device including (1) a pixel section including a plurality of light receiving sensors, (2) a plurality of vertical transfer registers in a horizontally spaced relation including (i) vertical transfer channel regions each between horizontally adjacent two of the light receiving sensors, and (ii) vertical transfer electrodes above the vertical transfer channel regions, (3) a plurality of horizontal transfer registers in a vertically spaced relation, each horizontal transfer register including a horizontal transfer channel region and a plurality of horizontal transfer electrodes formed side by side in a horizontal direction above the horizontal transfer channel region and in the same layer as the vertical transfer electrodes, (4) a horizontal-to-horizontal transfer portion between adjacent two of the horizontal transfer registers including (i) a horizontal-to-horizontal transfer channel region interconnecting respective parts of the horizontal transfer channel regions positioned under the horizontal transfer electrodes to which the transfer drive pulses having different phases are applied, and (ii) a horizontal-to-horizontal transfer electrode above the horizontal-to-horizontal transfer channel region in the same layer as both the vertical transfer electrodes and the horizontal transfer electrodes, and (5) a plurality of shunt lines interconnecting the horizontal transfer electrodes, which are supplied with the transfer drive pulses having the same phase, between adjacent two of the horizontal transfer registers; and a signal processing circuit configured to process an output signal of the solid-state imaging device.

* * * * *